United States Patent [19]

Norell

[11] Patent Number: 5,075,765
[45] Date of Patent: Dec. 24, 1991

[54] LOW STRESS MULTICHIP MODULE

[75] Inventor: Ronald A. Norell, Carlsbad, Calif.

[73] Assignee: Unisys, Blue Bell, Pa.

[21] Appl. No.: 586,473

[22] Filed: Sep. 21, 1990

[51] Int. Cl.⁵ .................................... H01L 23/40
[52] U.S. Cl. .................................... 357/74; 357/81
[58] Field of Search .................................... 357/74, 81

[56] References Cited

U.S. PATENT DOCUMENTS

| 3,310,716 | 3/1967 | Emeis | 357/74 |
| 3,753,054 | 8/1973 | Johnson | 357/81 |
| 4,235,285 | 11/1980 | Johnson et al. | 357/81 |
| 4,351,051 | 9/1982 | Van Alem et al. | 357/74 |
| 4,355,323 | 10/1982 | Kock | 357/74 |
| 4,399,452 | 8/1983 | Nakashima et al. | 357/74 |
| 4,399,453 | 8/1983 | Berg et al. | 357/74 |
| 4,456,334 | 6/1984 | Hery et al. | 357/74 |

OTHER PUBLICATIONS

Koopman, "Ground Plane Cover", IBM TDB, vol. 19, No. 9, Feb./1977, p. 3370.

Primary Examiner—Andrew J. James
Assistant Examiner—Viet Q. Nguyen
Attorney, Agent, or Firm—Charles J. Fassbender; Mark T. Starr

[57] ABSTRACT

A multichip integrated circuit module includes a ceramic substrate, a plurality of integrated circuit chips mounted on the substrate, and a metal lid which covers the chips and rests on the substrate without attaching to it. Also, the module includes two thin cylindrical members. One cylindrical member surrounds the substrate and makes an airtight solder joint to the substrate's perimeter, while the other cylindrical member surrounds the lid and makes an airtight solder joint to the lid's perimeter. Both cylindrical members run parallel to each other and make an airtight welded joint with each other. When the lid and substrate thermally expand at unequal rates, one thin cylindrical member is deflected by the other member. When a defective chip is replaced, the joint between the two cylindrical members is ground away; and subsequently, the remaining parallel portions of the cylindrical members are rewelded together.

11 Claims, 5 Drawing Sheets eq. 1  $\dfrac{F_1}{\ell} = c \times E \left( \dfrac{t_1}{h_1 + h_2 + h_3} \right)^3$ eq. 2  $t_1 \approx 10$ MILS, $h_1 = 125$ MILS $= t_2$
$h_2 = 25$ MILS, $h_3 = 85$ MILS eq. 3  $\dfrac{F_1}{\ell} = c \times E \left( \dfrac{10}{235} \right)^3 \approx \dfrac{k \times E}{8000}$ eq. 4  $\dfrac{F_2}{\ell} = c \times \left( \dfrac{t_2}{h_2} \right)^3$ eq. 5  $\dfrac{F_2}{\ell} = c \times E \left( \dfrac{125}{25} \right)^3 \approx k \times E\, 125$ eq. 6  $\dfrac{F_1}{\ell} \div \dfrac{F_2}{\ell} = \dfrac{1}{1,000,000}\,!$ ical members run parallel to each other and make an airtight welded joint with each other. When the lid and substrate thermally expand at unequal rates, one thin cylindrical member is deflected by the other member. When a defective chip is replaced, the joint between the two cylindrical members is ground away; and subsequently, the remaining parallel portions of the cylindrical members are rewelded together.

LOW STRESS MULTICHIP MODULE

BACKGROUND OF THE INVENTION

This invention relates to packages for integrated circuit chips; and more particularly, it relates to multichip modules which accommodate different degrees of thermal expansion among the package's components and which also enable defective chips to be easily replaced.

By an integrated circuit package or module is herein meant any airtight container which holds for one or more integrated circuit chips and which has electrical conductors that carry signals to and from the chips. Conventionally, the package is made of a ceramic substrate and a ceramic lid. This substrate and lid are shaped such that when they are placed together, a cavity is formed between them; and, one or more chips are disposed in the cavity. Solder is used to form an airtight seal between the lid and the substrate. Microscopic conductors are integrated in the substrate, and they carry electrical signals between the chips and the package's exterior.

A problem however with such prior art ceramic packages is that ceramic is a relatively poor thermal conductor in comparison to many other materials. In order to facilitate the removal of heat from the package, it is desirable to make the lid of better thermal conductor, such as a metal. However, metal has a substantially larger thermal coefficient of expansion than does ceramic; and, these expansion differences induce mechanical stress into the solder seal between the lid and the substrate when the chips heat up the package.

Further, the magnitude of the mechanical stress in the lid seal increases as the size of the package increases. Despite this, it is highly desirable to be able to make the package large so that multiple chips fit into it. Having multiple chips in one package reduces the distance and signal line capacitance between chips which improves their speed of operation, in comparison to having each chip in a separate package.

Thus, if the size of a multichip package having a ceramic substrate and metal lid is increased too much, the mechanical stress which is induced in the lid seal will become so large that it will crack the lid seal. If that occurs, contaminants can enter the package and there cause the integrated circuit chips to fail.

Also, as more chips are put into a package, the ability to be able to open and reseal the lid grows in importance. This is because the chips are expensive, so it becomes uneconomical to throw away the entire package whenever a single chip becomes defective. To enable any one defective chip to be replaced, ease of access to the chip cavity and ease of resealing the cavity lid are of major importance.

Accordingly, a primary object of the invention is to provide an improved multichip integrated circuit module which withstands large differences of thermal expansion between its lid and substrate, and which also affords ease of chip replacement.

BRIEF SUMMARY OF THE INVENTION

In accordance with the invention, a multichip integrated circuit module includes a ceramic substrate, a plurality of integrated circuit chips mounted on the substrate, and a metal lid which covers the chips and rests on the substrate without attaching to it. Also, the module includes two thin cylindrical members. One cylindrical member surrounds the substrate and makes an airtight solder joint to the substrate's perimeter, while the other cylindrical member surrounds the lid and makes an airtight solder joint to the lid's perimeter. Both cylindri

BRIEF DESCRIPTION OF THE DRAWINGS

Various features and advantages of the invention are described herein in conjunction with the accompanying drawings wherein.

DETAILED DESCRIPTION

Figure 1:
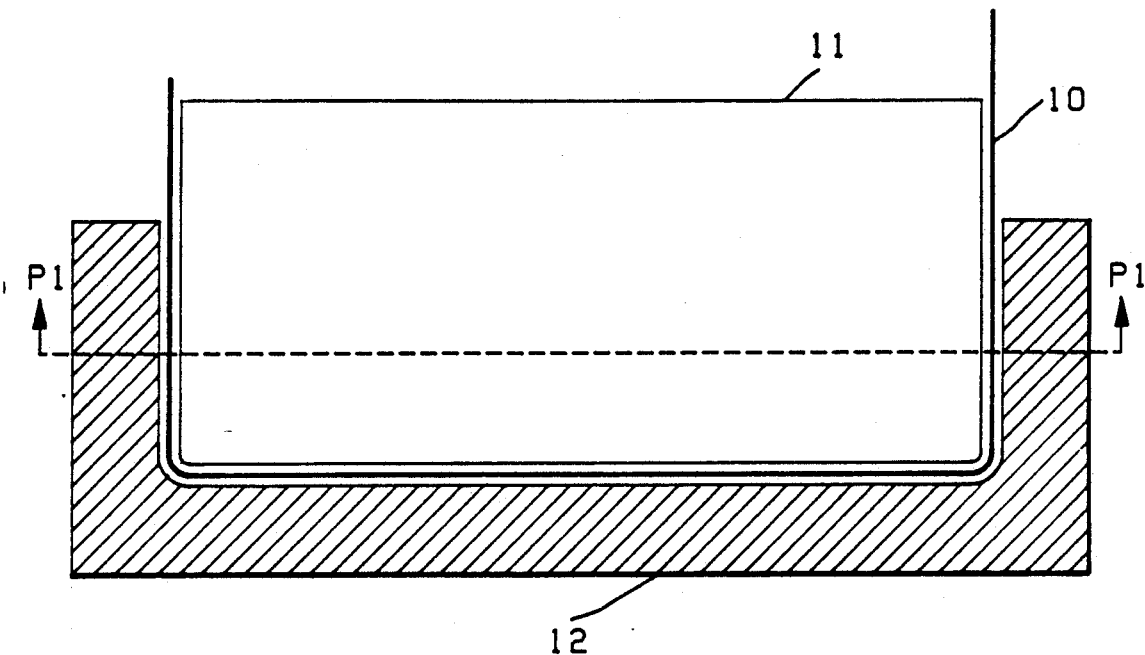
FIGS. 1 through 5 are sectional views which illustrate a preferred embodiment of the invention at various stages of its fabrication.

Referring now to FIGS. 1 through 5, a preferred embodiment of a multi-chip integrated circuit module whose structure is in accordance with the invention, as well as a preferred process for fabricating the module, will be described in detail. Beginning with FIG. 1, it shows an initial step of the fabrication process in which a thin metal sheet 10 is given a cup like shape. This is achieved by pressing the metal sheet 10 with a forming punch 11 into a closely fitting cavity of a die plate 12 as FIG. 1 shows in cross-section.

Figure 3:
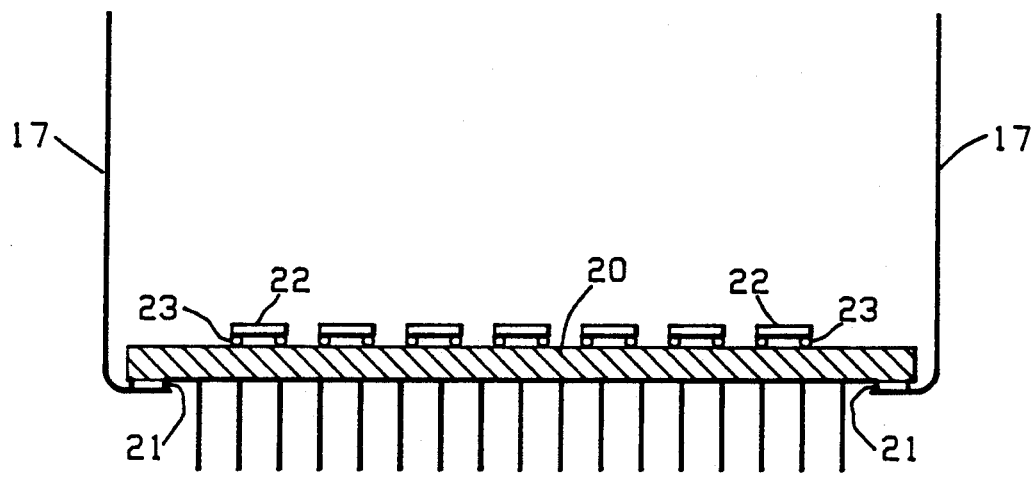

In the plane P1 which is perpendicular to the FIG. 1 section, the forming punch 11 is shaped to match and be slightly larger than the perimeter of a substrate which will be described shortly in conjunction with FIG. 3. This substrate's perimeter may be round, or rectangular, or irregular in shape as desired. Suitably, the metal sheet 10 is made of aluminum or copper or Kovar, and it is five to twenty mills thick.

Figure 2:
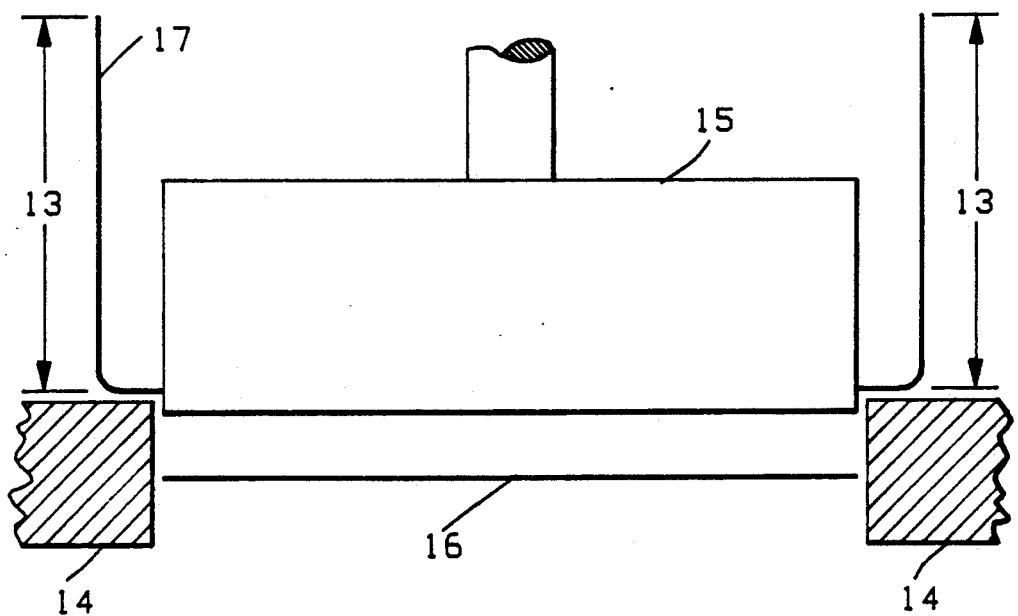

Following the above step, the sidewalls of the metal sheet 10 are trimmed to a uniform height 13. Thereafter, the metal sheet 10 is placed in another die 14, and a piercing punch 15 is used to cut a slug 16 from it as shown in FIG. 2. This produces a cylindrical member 17 for the multi-chip module which has thin L-shaped sidewalls.

Subsequently, the cylindrical member 17 is attached in an air-tight fashion to the perimeter of the above mentioned substrate. This substrate is shown in FIG. 3 as item 20. Preferably, the substrate 20 is made of ceramic and contains hundreds of microscopic signal paths in it which interconnect the chips. One such substrate is described in U.S. Pat. No. 4,721,821 to H. Vora. Substrate 20 and member 17 are attached by placing a high temperature solder 21 such as a gold-tin mixture between them, and running that assembly through a belt furnace. Thereafter, multiple integrated circuit chips 22 are mounted on the substrate 20 via a low temperature solder 23, such as a lead-tin mixture.

Figure 4:
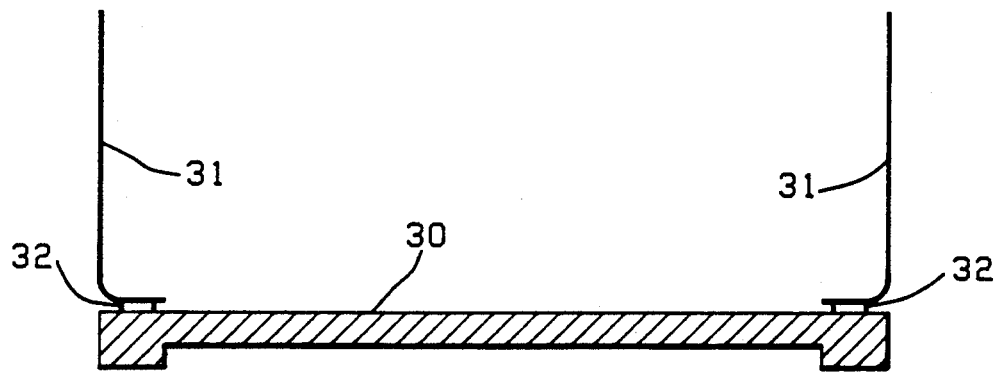

Next, as is shown in FIG. 4, a lid 30 is provided which is shaped to cover all of the chips on the substrate 20. Lid 30 is made of a material having a high thermal conductivity such as copper or aluminum. Attached to the perimeter of lid 30 is a second cylindrical member 31 which has thin L-shaped sidewalls. Member 31 is formed by repeating the previously described steps of FIGS. 1 and 2. Attachment between the cylindrical member 31 and lid 30 is air-tight and is made by a high temperature solder 32.

Figure 5:
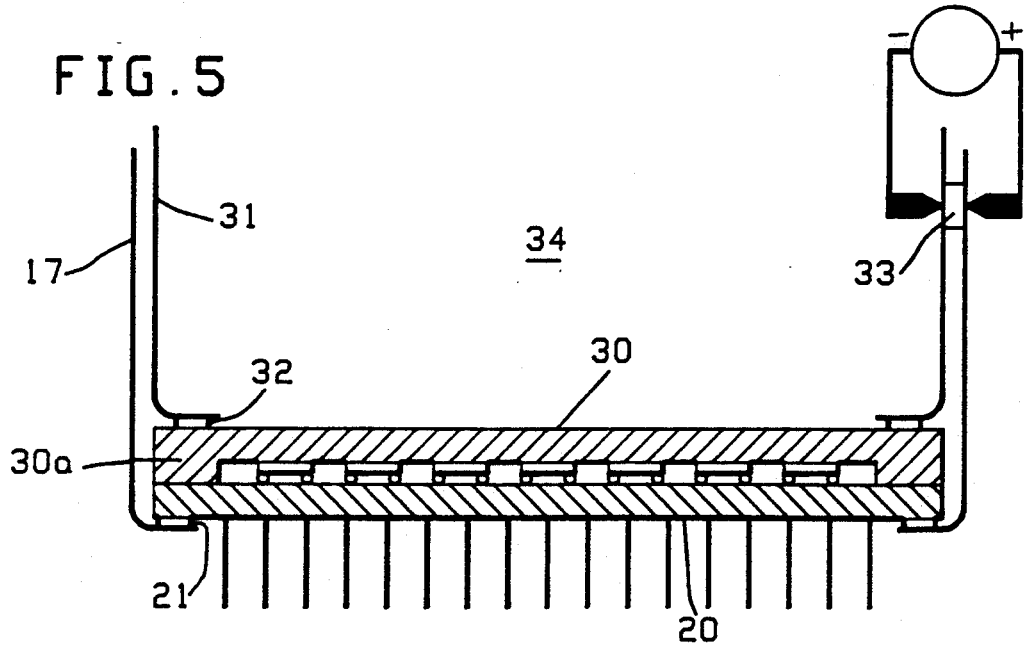

To complete the fabrication process, the lid 30 with its attached cylindrical member 31 is placed over the chips 22 as shown in FIG. 5. In that position, a thickened rim 30a on the lid holds the remainder of the lid within one-two mills of the chips to facilitate heat transfer from the chips through the lid. Also, the vertical portion of the L-shaped sidewall in member 31 lies adjacent to the vertical portion of the L-shaped sidewall in member 17. Those two vertical sidewall portions are joined together via a seam weld 33 to thereby complete the multichip module 34.

One primary feature of the multi-chip module 34 is that it readily accommodates large differences in the rates at which the substrate 20 and lid 30 thermally expand when they are heated by the chips 22. Aluminum for example has a thermal expansion coefficient of $25 \times 10^{-6}/°C$. and ceramic has a thermal expansion coefficient of $6 \times 10^{-6}/°C$. This accommodation occurs because the cylindrical member 17 operates as a beam spring which is easily deflected by the second cylindrical member 31 when the lid 30 and substrate 20 expand unequally. Such beam spring deflection is shown in FIG. 6.

Initially, when no power is applied to the chips 22, the position of the joint 33 between the cylindrical members 17 and 31 is as shown by reference numeral 40. Later when power is applied to the chips, they heat up and cause the substrate 20 and lid 30 to expand. If the lid 30 expands faster than the substrate 20, then member 31 will push against and deflect the cylindrical member 17 such that the position of the joint between them is as indicated by referenced numeral number 41. Movement from position 40 to position 41 occurs without over stressing any of the components and/or joints in module 34 because member 17 is thin and is positioned to offer little resistance to being deflected. Similar deflection occurs in member 17, but in an opposite direction, if substrate 20 expands faster than the lid 30.

Figures 6, 7:
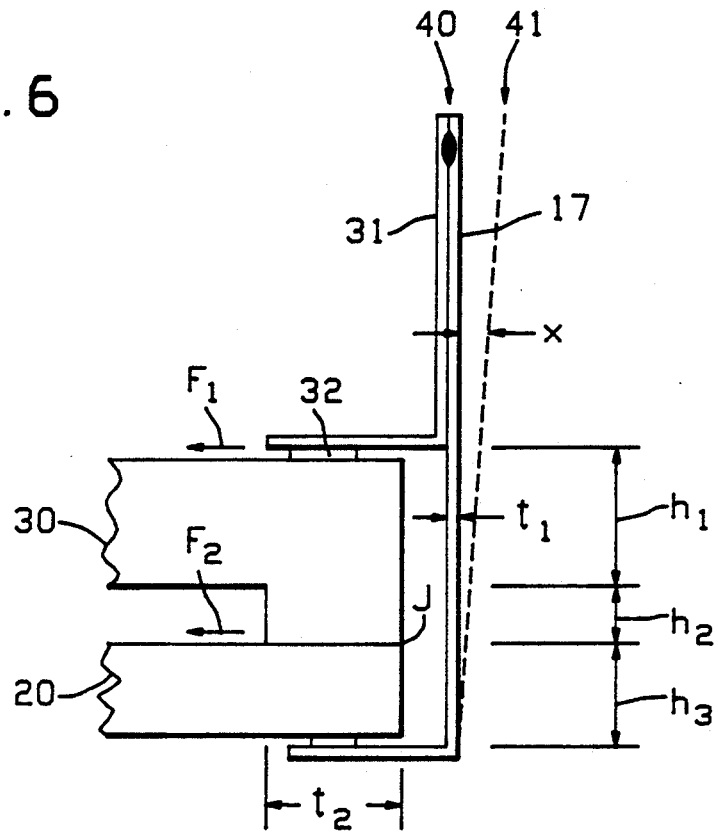
FIG. 6 is a schematic diagram which illustrates how the completed package of FIG. 5 accommodates different thermal expansion rates in its substrate and lid.
FIG. 7 is a set of equations which quantitatively analyzes the degree to which the disclosed package reduces mechanical stress.

To describe the above point in a quantitative fashion, a mathematical analysis of the FIG. 6 deflection is given in FIG. 7. There, equation 1 gives the force per unit length which is exerted on the solder joint 32 by member 17 as it is deflected. In equation 1, the length "l" is the distance around the perimeter of the lid; "c" is a proportionality constant; "x" is the distance by which member 17 is deflected at the point where it is pushed by the horizontal portion of member 31; "E" is the module of elasticity of the material of which member 17 is made; "t" is the thickness of member 17; and the quantity "$h_1 + h_2 + h_3$" is the total height of member 17 which deforms to accommodate different expansion rates in the lid 30 and substrate 20.

As a numerical example of the above, suppose that the quantities $t_1$, $h_1$, $h_2$, and $h_3$ respectively equal 10 mills, 125 mills, 25 mills, and 85 mills. This is given by equation 2. Substituting those numbers into equation 1 yields equation 3 as an expression of the force per unit length on the solder joint 32.

For comparison purposes, suppose now that the cylindrical members 17 and 31 are removed from the multichip module and that the lid 30 is soldered directly to the substrate 20 in a joint "J" around the rim 30a. In that case, when the lid 30 and substrate 20 thermally expand at different rates, the force per unit length which is induced on the solder joint J due to deflection in the rim 30a is given by equation 4. In equation 4, the parameters "c" and "E" are the same as defined above in equation 1; "$t_2$" is the thickness of the rim 30a; "$h_2$" is the height of the rim 30a; and "x" is the amount of deflection in the rim.

Utilizing the same numbers as given in equation 2 and substituting them into equation 4 yields equation 5 as an expression of the deflection force per unit length in the joint J. This force per unit length is huge compared to the force per unit length as given by equation 3. Dividing equation 3 by equation 5, as is done via equation 6, gives a ratio of the two force per unit lengths of 1 million!

Figure 8:
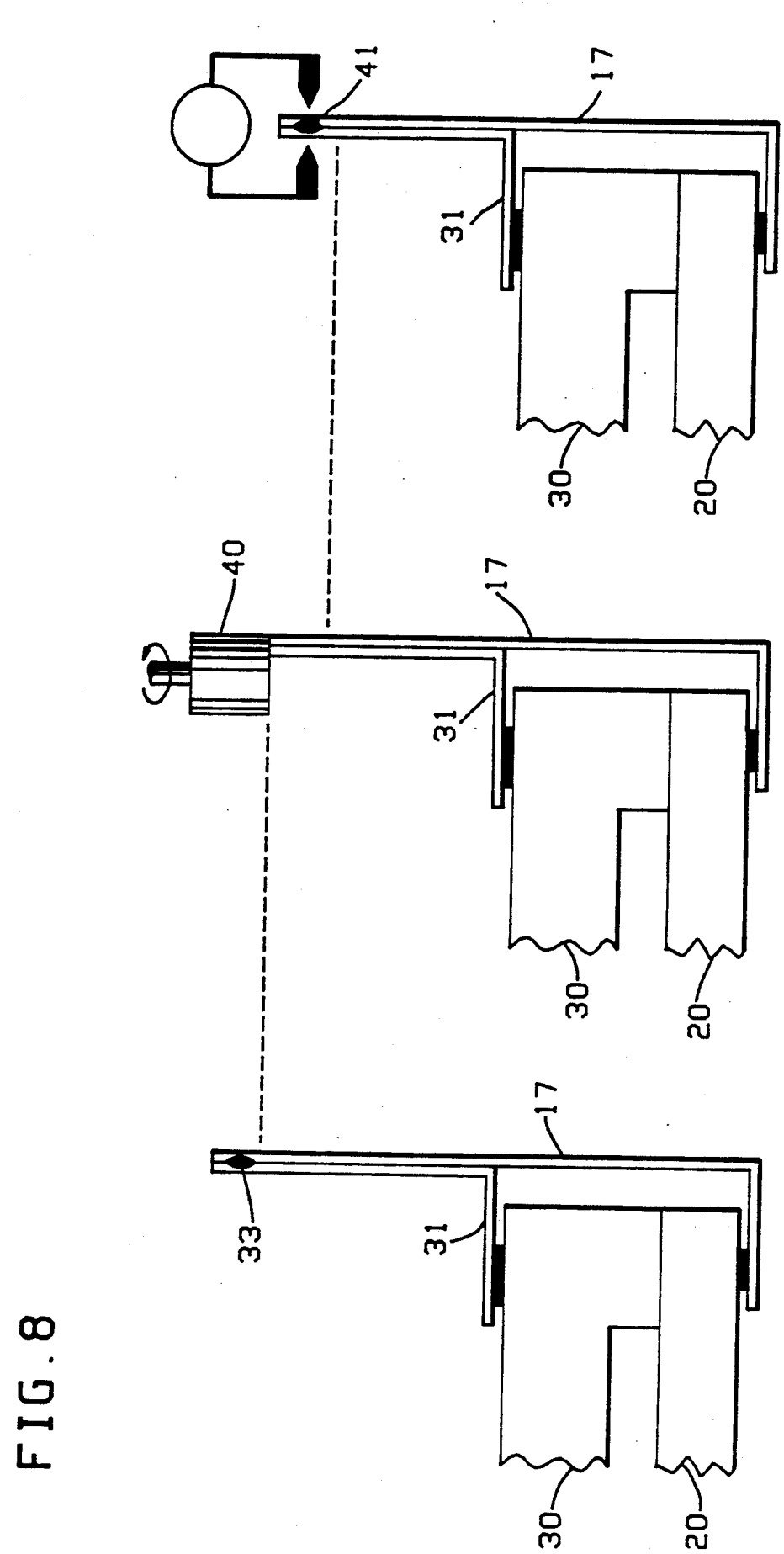
FIG. 8 is a schematic diagram which illustrates how the package is opened and resealed in order to repair a defective chip; and, FIGS. 9A-9E illustrate various modifications that can be made to the preferred embodiment in FIG. 5.

Another major feature of the multi-chip module 34 is that the module can be easily opened and reclosed so that a defective chip can be replaced. This repair process occurs as illustrated in FIG. 8. To open the module, the seam weld 33 which is between the cylindrical member 17 and 31 is ground away by a rotating abrasive wheel 40. This provides access to the chips 22 and enables a defective chip to be replaced. Thereafter, the lid 30 is repositioned back on top of the substrate 20, and a new seam weld 41 is made between the remaining vertical portions of the cylindrical members 17 and 31. Such a repair process can be carried out several times by simply making the initial height 13 of the cylindrical members 17 and 31 sufficiently large.

A preferred embodiment of the invention has now been described in detail. In addition, however, many changes and modifications can be made to the above described embodiment without departing from the nature and spirit of the invention. Some of these modified embodiments are shown in FIGS. 9A–9E.

Figure 9A:
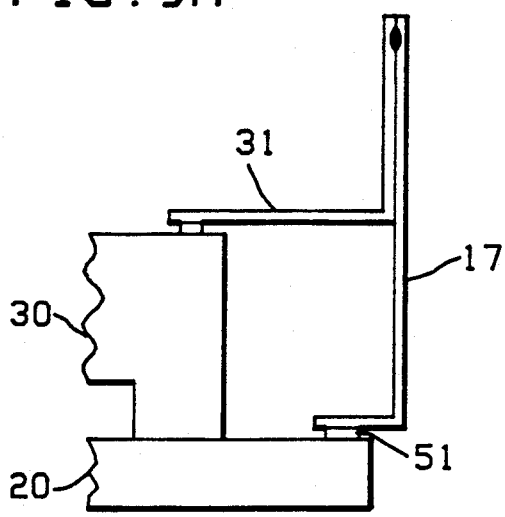

In the embodiment of FIG. 9A, the modification which is made changes the location on substrate 20 where member 17 attaches. Specifically, member 17 attaches to the same surface of substrate 20 on which the chips 22 are mounted. This is indicated by reference numeral 51.

Figure 9B:
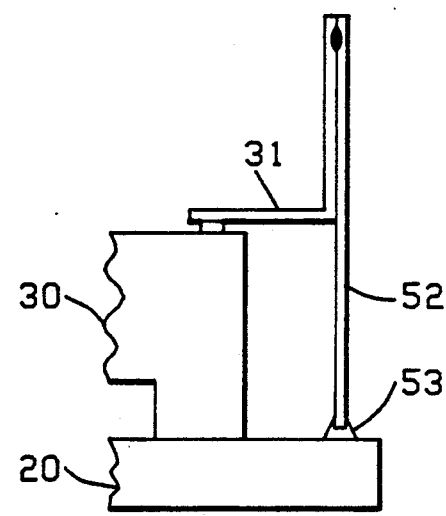
Figure 9C:
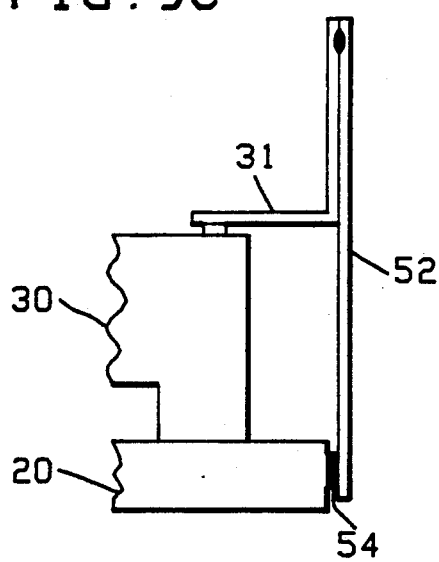

In the FIG. 9B embodiment, member 17 is replaced with a cylindrical member 52 whose sidewalls are straight rather than L-shaped. One edge of these straight sidewalls attaches to the perimeter of substrate 20 on the same surface to which the integrated circuit chips 22 are mounted. This is indicated by referenced numeral 53.

In the embodiment of FIG. 9C, member 17 is again replaced with the cylindrical member 52 which has straight sidewalls. But here in comparison to the FIG. 9B embodiment, member 52 is attached to an edge of the substrate 20 which is perpendicular to the surface to which the chips 22 are mounted. This is indicated by reference numeral 54.

Figure 9D:
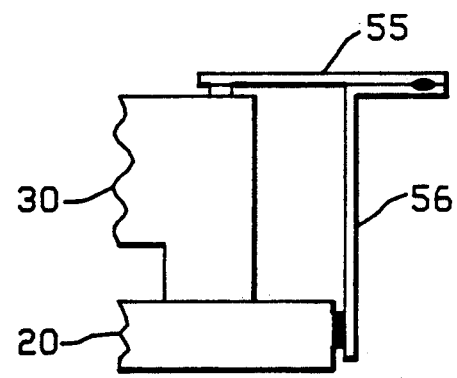

In the embodiment of FIG. 9D, member 31 is replaced with a washer shaped cylindrical member 55; and, member 17 is replaced with a cylindrical member 56 having sidewalls which are L-shaped and which are oriented upside down. Member 56 in FIG. 9D is attached to the edge of the substrate 20 that is perpendicular to the surface on which the chips 22 are mounted. Alternatively, member 56 can be attached to the same surface of substrate 20 on which the chips 22 are mounted, as is the case in FIG. 9B.

Figure 9E:
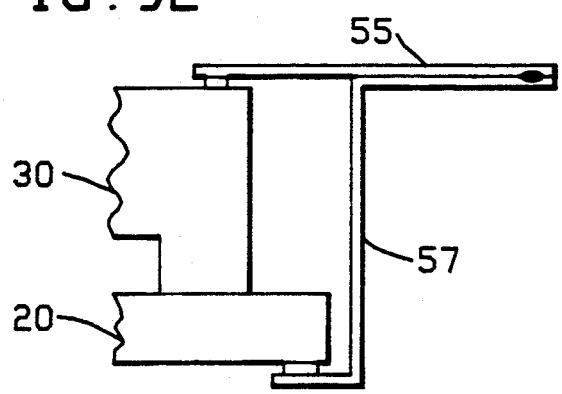

In the FIG. 9E embodiment, member 31 is replaced with the washer shaped cylindrical member 55, while member 17 is replaced with a cylindrical member 57 having S-shaped sidewalls. Member 57, in FIG. 9E, is attached to the bottom surface of substrate 20, as was the case in FIG. 5. Alternatively, member 57 can be attached to the surface of substrate 20 on which the chips 22 are mounted.

As another modification, the airtight joint between the substrate 20 and its thin cylindrical member can be welded instead of soldered. This modification also applies to the joint between the lid 30 and its thin cylindrical member. Any such welded joint, as well as the joint between the two cylindrical members can be made by fusing those components via an electric current or a laser beam or an electron beam.

As still another modification, the cylindrical member 31 in the embodiments of FIGS. 5, 9A, 9B and 9C can be thick in cross-section rather than thin. This is because it is the other cylindrical member 17 or 52 which deflects to accommodate unequal thermal expansion between the lid 30 and substrate 20. Similarly, member 55 in the embodiments of FIGS. 9D and 9E can be thick in cross-section.

As yet another modification, the lid 30 can be provided with an input port to enable the cavity between the lid and substrate to be filled with a thermally conductive liquid rather than air. This would enhance heat transfer from the chips through the lid. With this modification, the liquid can have any thermal expansion coefficient, since expansion of the liquid will be accommodated by a bowing or bulging type of deflection in members 17, 52, 56 or 57.

Accordingly, in view of all of the above modifications, it is to be understood that the invention is not limited to any one particular embodiment but is defined by the appended claims.

What is claimed is:

1. A multichip module, comprising:
    a substrate on which a plurality of integrated circuit chips are mounted;
    a lid having a top surface which covers said chips on said substrate but is not attached to said substrate;
    said lid and said substrate having different rates of thermal expansion;
    a first cylindrical member which surrounds said substrate and said lid and which is hermetically joined to the perimeter of said substrate; a second cylindrical member which surrounds said lid and which is hermetically joined to said top surface of said lid;
    said first and second cylindrical members having respective ends that run parallel to each other and are hermetically joined together at said respective ends; and,
    at least one of said cylindrical members having a thin flexible sidewall which deflects like a beam spring to accommodate said different thermal expansion rates.

2. A module according to claim 1 wherein said thin flexible sidewall of said at least one cylindrical member is L-shaped.

3. A module according to claim 2 wherein said substrate has a top surface to which said chips are mounted and a bottom surface to which the horizontal leg of said L-shaped sidewall is hermetically joined.

4. A module according to claim 2 wherein said substrate has a top surface to which said chips are mounted and to which the horizontal leg of said L-shaped sidewall is hermetically joined.

5. A module according to claim 2 wherein said substrate has a top surface to which said chips are mounted and a surrounding edge which is perpendicular thereto and to which the vertical leg of said L-shaped sidewall is hermetically joined.

6. A module according to claim 1 wherein said thin flexible sidewall of said at least one cylindrical member is straight.

7. A module according to claim 6 wherein said substrate has a top surface to which said chips are mounted and to which an edge of said straight sidewall is hermetically joined.

8. A module according to claim 6 wherein said substrate has a top surface to which said chips are mounted and a surrounding edge which is perpendicular thereto and to which said straight sidewall is hermetically joined.

9. A module according to claim 1 wherein said thin flexible sidewall of said at least one cylindrical member is S-shaped.

10. A module according to claim 9 wherein said substrate has a top surface to which said chips are mounted and a bottom surface to which a leg of said S-shaped sidewall is hermetically joined.

11. A module according to claim 9 wherein said substrate has a top surface to which said chips are mounted and to which a leg of said S-shaped sidewall is hermetically joined.

* * * * *